US 6,529,020 B1

(12) United States Patent
Terrell

(10) Patent No.: US 6,529,020 B1
(45) Date of Patent: Mar. 4, 2003

(54) METHODS AND SYSTEMS FOR AUTOMATED EMISSIONS MEASURING

(75) Inventor: David L. Terrell, Earlysville, VA (US)

(73) Assignee: GE Fanuc Automation North America, Inc., VA (US)

(*) Notice: Subject to any disclaimer, the term of this patent is extended or adjusted under 35 U.S.C. 154(b) by 4 days.

(21) Appl. No.: 09/713,625

(22) Filed: Nov. 15, 2000

(51) Int. Cl.[7] .............................................. G01R 27/02
(52) U.S. Cl. ........................ 324/750; 324/95; 324/627
(58) Field of Search ....................... 250/363.01, 370.06, 250/354.1, 328; 324/750, 96, 95, 627, 332, 501, 529; 600/409

(56) References Cited

U.S. PATENT DOCUMENTS

| 4,760,355 | A | 7/1988 | Dash et al. |
| 5,006,788 | A | 4/1991 | Goulette et al. |
| 5,256,960 | A | 10/1993 | Novini |
| 5,285,164 | A | 2/1994 | Wong |
| 5,404,098 | A | 4/1995 | Osburn |
| 5,430,456 | A | 7/1995 | Osburn et al. |
| 5,436,555 | A | 7/1995 | Locke et al. |
| 5,559,427 | A | 9/1996 | Hinds |
| 5,828,452 | A | 10/1998 | Gillispie et al. |
| 5,884,202 | A | 3/1999 | Arjomand |
| 5,991,036 | A | 11/1999 | Frankel |
| 6,028,423 | A | 2/2000 | Sanchez |
| 6,255,830 | B1 * | 7/2001 | Rollin et al. ............... 174/35 R |
| 6,259,516 | B1 | 7/2001 | Carter et al. |
| 6,268,738 | B1 | 7/2001 | Gunthorpe et al. |

* cited by examiner

Primary Examiner—Christine Oda
Assistant Examiner—Vincent Q. Nguyen
(74) Attorney, Agent, or Firm—Karl A. Vick, Esq.; Armstrong Teasdale LLP

(57) ABSTRACT

A system for measuring electromagnetic emissions from electronic devices includes an semi-anechoic chamber, a computer, an EMI receiver, and a multi-device controller. The chamber houses devices being tested and test equipment for automated emissions scanning. The computer receives emissions data from test equipment housed within and outside the chamber and operates a multi-device controller which controls the test equipment. The method includes wide-band measurements of emissions, narrow-band measurements of emissions chosen from the wide-band measurement, determining a maximum quasi-peak value for optimal cable and wiring position, and communicating results to a word-processing program to report measured values against testing limits.

9 Claims, 2 Drawing Sheets

METHODS AND SYSTEMS FOR AUTOMATED EMISSIONS MEASURING

BACKGROUND OF THE INVENTION

This invention relates generally to methods and systems for testing and more specifically to methods and systems for measuring electromagnetic emissions from electronic devices.

In the electronics industries, it is desirable to lessen electromagnetic emissions which may cause electromagnetic interference with other devices. Therefore, before an electronic device is sold in most parts of the world, the device is typically tested to determine levels of radiated and conducted emissions at various frequencies. A Programmable Logic Controller ("PLC") product which cannot claim an industrial exemption is one example of an electronic device from which conducted and radiated emissions are measured. The emissions are measured in a range based on the highest frequency generated or used by the device or based on the highest frequency on which the device operates. Emissions from devices are measured to ensure compliance with regulations imposed by the United States Federal Communications Commission (FCC) and counterpart regulatory agencies in other countries.

It is well known that physical positions of various wires and cables connected to electronic devices can affect measured levels of radiation. For this reason, most regulatory agencies that address inadvertent electromagnetic radiation specify that wires and cables "be placed into positions that maximize field strength."

Practical experience reveals, however, that in a complex electronic device, there is no single position that results in maximum emissions at all frequencies. Rather, maximum emissions occur at different relative positioning of the device's cables and wiring for each different frequency. Therefore it is desirable to find an optimal or "best" cable and wiring positioning at each problem frequency for the device being tested.

Known emissions test systems suffer from two limitations. One limitation is that known systems are susceptible to human error because extensive operator intervention for equipment operation during an emissions scan is required. The second limitation is that typical known systems are incapable of computing a maximum quasi-peak value for optimally placed cables.

BRIEF SUMMARY OF THE INVENTION

In an exemplary embodiment, an emissions measuring system minimizes human error factor by automating most of an emissions scan test procedure, including prompting a test engineer to perform cable manipulations at appropriate times during the testing procedure. In addition, data is recorded during the testing procedure while performing cable manipulations for complex electronic devices.

More particularly, the emissions measuring system performs a wide-band measurement of conducted and radiated emissions across a frequency spectrum of interest. The system also performs a narrow-band measurement of conducted and radiated emissions around select emissions resulting from the wide-band measurement. Additionally, the system determines a maximum quasi-peak value for optimal cable and wiring position from the narrow-band measurement, and communicates with a standard word-processing program to generate reports of measured emissions values, measured quasi-peak values and associated test conditions.

DETAILED DESCRIPTION OF THE INVENTION

Figure 1:
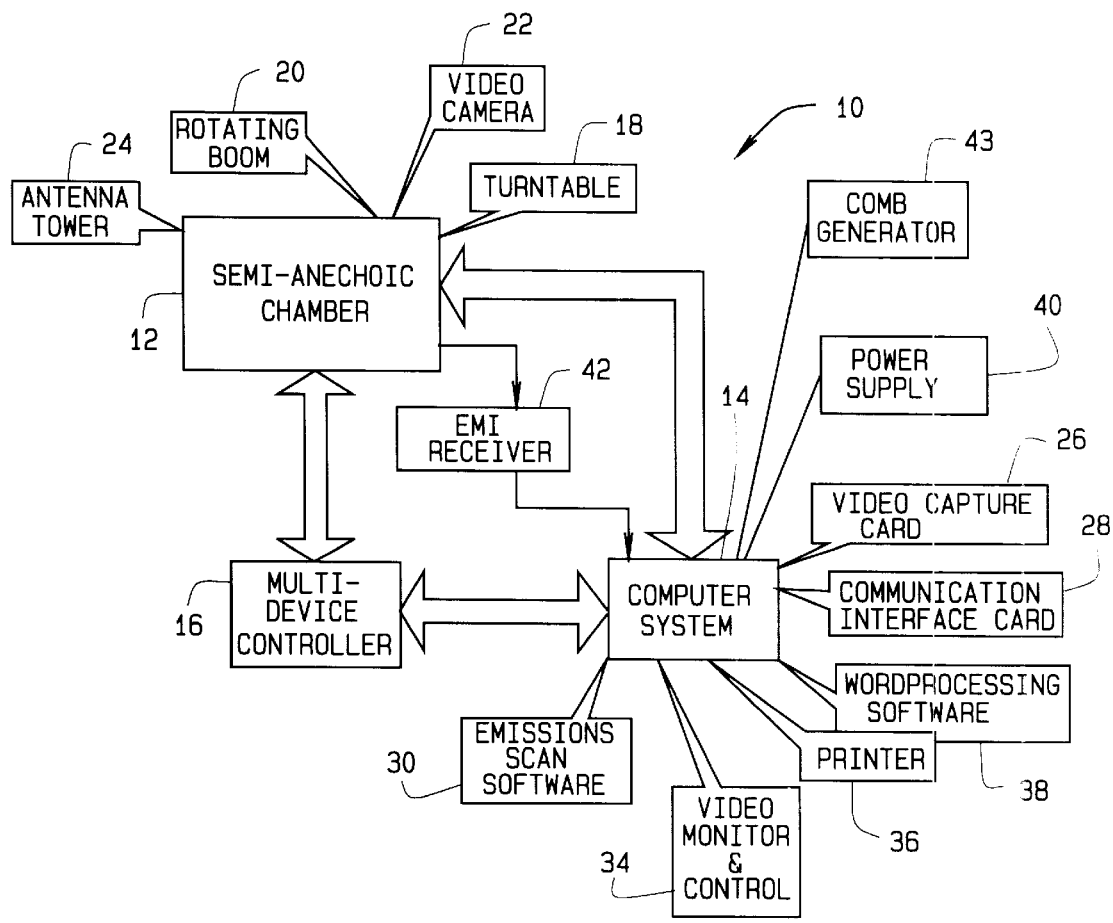
FIG. 1 is a block diagram of an automated electromagnetic emission measuring system

FIG. 1 is a block diagram of an exemplary embodiment of an electromagnetic emissions measuring system 10 including a semi-anechoic chamber 12 connected to a computer system 14 and a multi-device controller 16. Semi-anechoic chamber 12 houses an electronic device being tested 17 and testing equipment used to automate an emissions scan. The testing equipment includes an electromechanical turntable 18, a two-position rotating boom 20, a video camera 22 and an electromechanical antenna tower 24. Computer system 14, includes a video capture card 26, a communication interface card 28, an emissions scan software package 30, a video monitor and a control unit 34, a printer 36, a word-processing software package 38, and a power supply 40. Computer system 14 operates multi-device controller 16, and retrieves data regarding test conditions. Computer system 14 also operates an emissions receiver (EMI receiver) 42 or spectrum analyzer and retrieves data regarding emissions values, quasi-peak values, and frequency characteristics of the electrical device being tested. Multi-device controller 16 controls testing equipment inside semi-anechoic chamber 12.

Measuring system 10 performs four major tasks and a number of support tasks. The four major tasks include performing a wide-band measurement of conducted and radiated emissions across a frequency spectrum of interest, performing a narrow-band measurement of conducted and radiated emissions around select emissions resulting from the wide-band measurement, determining a maximum quasi-peak value for optimal cable and wiring positioning from the narrow-band measured values, and communicating with a standard word-processing program to generate reports of measured emissions values and measured quasi-peak values and associated test conditions.

Measuring system 10 also performs support tasks including automatic control and calibration of electromechanical turntable 18 and automatic control and calibration of electromechanical antenna tower 24 including polarization and height. Measuring system 10 automatically controls an emissions receiver 42 or spectrum analyzer. System 10 automatically verifies performance by measuring a large number of harmonics from a comb generator 43 and contrasting measured values with historical data. Antenna polarity is manually selected.

Measuring system 10 first performs a wide-band measurement of a frequency spectrum of interest. Electronic device being tested 17 is positioned on turntable 18, turntable 18 is then rotated 360 degrees. Rotating boom 20 is positioned in both vertical and horizontal polarities, and antenna tower 24 is moved over a specified range of heights while measuring emissions. A measured emission at each frequency is compared with an applicable standard set by government agencies. System 10 is configured to select a number of emissions at frequencies where the emissions are highest with respect to the applicable standards and subjects these emissions to more precise measurements using a narrow-band measurement process. System 10 is further configured to direct cable manipulation during the wide-band measurement process. In one embodiment, cable manipulation is an integral part of the wide-band measurement process.

System 10 also measures all emissions within a narrow band around each emission peak determined during the wide-band measurement process. System 10 takes a narrow-band measurement by rotating turntable 18 to a target location, positioning rotating boom 20 in both vertical and horizontal polarities, directing cable manipulation and positioning, moving antenna tower 24 across a specified range of heights that is smaller than with the wide-band measurement, measuring resulting emissions, and compiling a list of resulting emissions. System 10 is configured to direct cable manipulation during the narrow-band measurement process. In one embodiment, cable manipulation is an integral part of the narrow-band measurement process. System 10 is configured with integrated cable manipulation strategies for maximizing emissions from a cable placement.

If the peak value of any emission compiled during the narrow-band measurement exceeds the applicable standard or is within a predetermined safety margin of the applicable standard, system 10 automatically measures that emission using a quasi-peak detector. Peak values measured at the multiple cable locations during cable manipulation and the peak and quasi-peak values measured after cable manipulation are used by system 10 to calculate quasi-peak values for optimized cable positions. Optimized cable positions are those cabling positions which configure the electrical device being tested to satisfy the regulatory emissions standards. Further, the measured quasi-peak values are scaled as necessary to reflect a maximum quasi-peak value that corresponds to cables being positioned to produce highest measured emissions, that is, maximum quasi-peak values from measured values are automatically computed.

Finally, system 10 communicates with a standard word-processing program to produce both formal reports and more concise engineering summary reports of measured emissions values, measured quasi-peak values and associated test conditions. Measured values and associated test conditions are displayed in both tabular form and as a standard frequency-domain graph.

Figure 2:
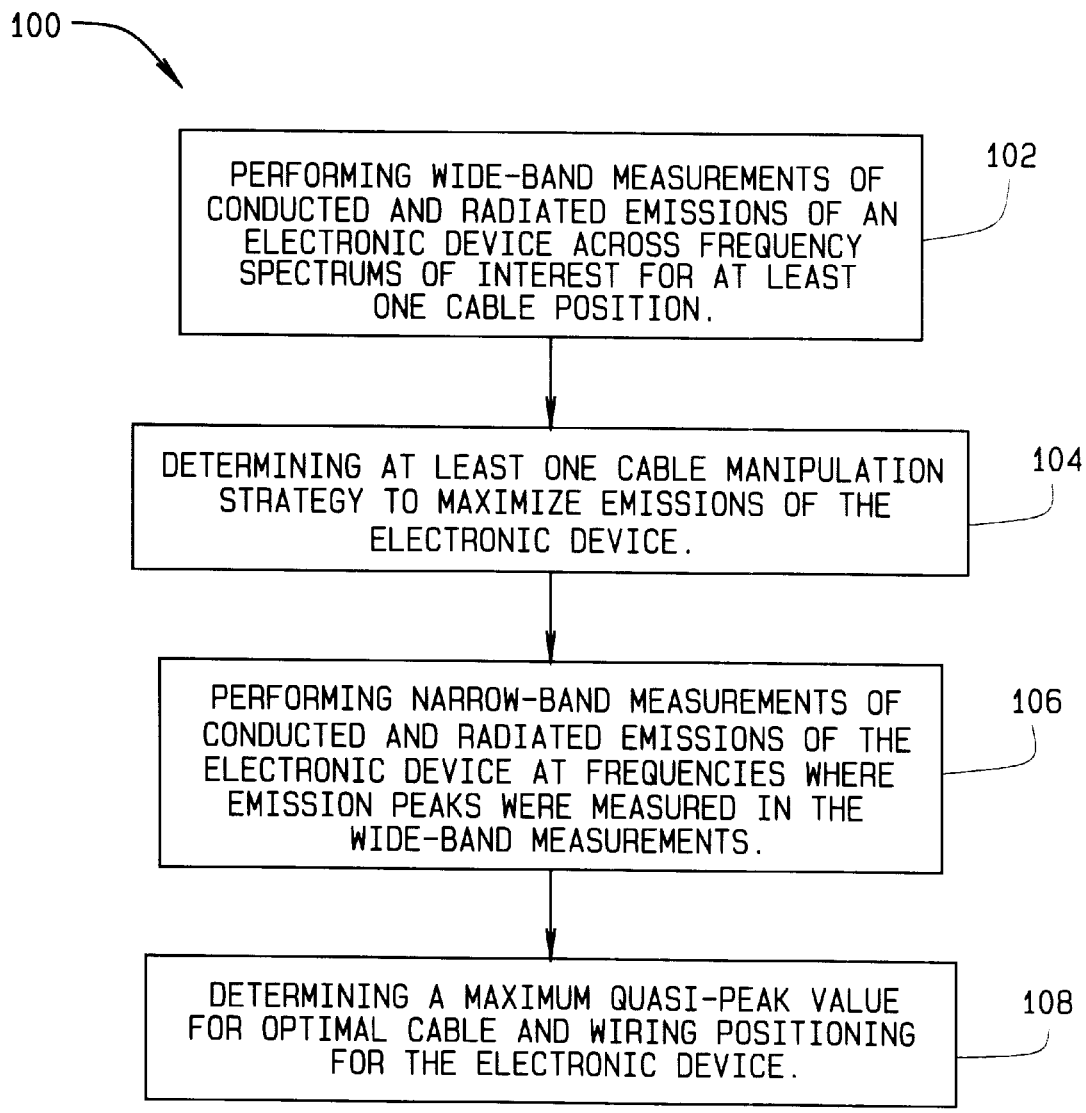
FIG. 2 illustrates a method for maximizing a plurality of measured electromagnetic emissions emitting from an electronic device.

FIG. 2 is a method 100 for maximizing a plurality of measured electromagnetic emissions emitting from an electronic device 17 using an automated emissions measuring system 10 configured to direct cable positioning during an emissions test. Method 100 includes performing 102 wide-band measurements of conducted and radiated emissions of electronic device 17 across frequency spectrums of interest for at least one cable position, determining 104 at least one cable manipulation strategy to maximize emissions, performing 106 narrow-band measurements of conducted and radiated emissions of electronic device 17 at frequencies where emission peaks were measured in the wide-band measurements, and determining 108 a maximum quasi-peak value for optimal cable and wiring positioning.

Using system 10 eliminates operator intervention from the bulk of the emissions test, thereby reducing likelihood of operator error. By directing cable manipulation at several critical points in the overall emissions test, the subset of all possible cable positions explored is greatly increased, as is the likelihood of discovering cable positions that produce maximum emissions at a given frequency.

While the invention has been described in terms of various specific embodiments, those skilled in the art will recognize that the invention can be practiced with modification within the spirit and scope of the claims.

What is claimed is:

1. An automated emissions measuring system comprising:
    a semi-anechoic chamber configured to house an electronic device being tested;
    at least one piece of testing equipment positioned within said semi-anechoic chamber, said testing equipment comprising at least one of an electromechanical turntable, a two-position rotating boom, and an electromechanical antenna tower;
    a multi-device controller coupled to said testing equipment; and
    a computer system coupled to at least one of said multi-device controller and said testing equipment and configured to perform wide-band measurements of conducted and radiated emissions across frequency spectrums of interest for at least one cable placement within said semi-anechoic chamber, determine cable manipulation strategies to maximize emissions, perform narrow-band measurements of conducted and radiated emissions at frequencies which had emission peaks in the wide-band measurement, determine maximum quasi-peak value for optimal cable and wiring positioning and to produce reports of measured emissions values and measured quasi-peak values.

2. A system according to claim 1 wherein said computer system configured to automatically verify performance of said system by measuring a large number of harmonics from a comb generator and contrasting measured values with historical data.

3. A system according to claim 1 wherein said emissions measuring system configured to measure cable loss.

4. A system according to claim 1 wherein said electromechanical turntable configured for self-calibration.

5. A system according to claim 1 wherein said computer system configured to recognize an optimal cable positioning placement based on received data regarding measured emission values, measured quasi-peak values and associated test conditions.

6. A system according to claim 1 wherein said multi-device controller configured to automatically control at least one of said electromechanical turntable, said two-position rotating boom and said electromechanical antenna tower housed inside said semi-anechoic chamber.

7. A system according to claim 1 wherein said antenna tower configured to have both a vertical and a horizontal antenna polarity.

8. A system according to claim 7 wherein said antenna tower configured for self-calibration.

9. A system according to claim 7 wherein said antenna tower further configured for manual selection of antenna polarity.

* * * * *